US011522494B2

(12) United States Patent
Buchhold et al.

(10) Patent No.: US 11,522,494 B2
(45) Date of Patent: Dec. 6, 2022

(54) INVERTER

(71) Applicant: SMA Solar Technology AG, Niestetal (DE)

(72) Inventors: Stefan Buchhold, Lohfelden (DE); Jens Friebe, Vellmar (DE); Michael Kotthaus, Niestetal (DE); Ephraim Moeser, Fuldatal (DE); Torsten Soederberg, Soehrewald (DE); Thomas Wappler, Guxhagen (DE)

(73) Assignee: SMA Solar Technology AG, Niestetal (DE)

( * ) Notice: Subject to any disclaimer, the term of this patent is extended or adjusted under 35 U.S.C. 154(b) by 284 days.

(21) Appl. No.: 16/901,179

(22) Filed: Jun. 15, 2020

(65) Prior Publication Data

US 2020/0313607 A1 Oct. 1, 2020

Related U.S. Application Data

(63) Continuation of application No. PCT/EP2018/084025, filed on Dec. 7, 2018.

(30) Foreign Application Priority Data

Dec. 15, 2017 (DE) ..................... 20 2017 107 643.1

(51) Int. Cl.
*H02S 40/32* (2014.01)
*H05K 7/20* (2006.01)
*H02M 7/00* (2006.01)

(52) U.S. Cl.
CPC ............. *H02S 40/32* (2014.12); *H05K 7/209* (2013.01); *H05K 7/20463* (2013.01); *H02M 7/003* (2013.01)

(58) Field of Classification Search
CPC ........... H02M 7/44; H02M 7/487–493; H02M 7/5387; B60L 3/003; B60L 15/51;
(Continued)

(56) References Cited

U.S. PATENT DOCUMENTS 6,362,964 B1 3/2002 Dubhashi
2006/0274561 A1* 12/2006 Ahmed ................. H02M 7/003
361/699

(Continued)

FOREIGN PATENT DOCUMENTS

CN 206060577 U 3/2017
JP 2003332526 A * 11/2003
(Continued)

*Primary Examiner* — Zachary Pape
*Assistant Examiner* — Amir A Jalali
(74) *Attorney, Agent, or Firm* — Eschweiler & Potashnik, LLC

(57) ABSTRACT

An inverter for a photovoltaic system includes a substantially planar baseplate having a front and a rear, wherein the rear forms an outer rear wall of the inverter, and having at least one platform-like elevation that rises in the direction of the front of the baseplate. The inverter also includes a printed circuit board having one or more heat-generating components mounted thereon, wherein the printed circuit board is installed on the baseplate such that the one or more heat-generating components are arranged on the printed circuit board in the region of the platform-like elevation and are in thermal contact with the platform-like elevation. The inverter further includes a potting compound that fills a space on the front of the baseplate and surrounds at least partially the printed circuit board, and a cover arranged on or in the potting compound that adjoins the baseplate, so that the baseplate and the cover surrounding at least part of the potting compound form a housing. The inverter also includes at least four DC connectors that are arranged in pairs on at least one of the lateral end faces of the housing (Continued)

and at least part of which is cast in the potting compound, and an AC connector that is arranged on one of the lateral end faces of the housing, wherein electrical contacts of the AC connector are connected to the printed circuit board.

20 Claims, 3 Drawing Sheets

(58) Field of Classification Search
CPC ... B60L 2210/40; H01L 21/4871–4882; H01L 23/12; H01L 23/295; H01L 23/367; H01L 23/34–3675; H01L 23/3737; H01L 23/49838; H01L 24/48; H01L 25/072; H01L 25/16; H01L 25/18; H01L 29/00; H01H 9/52; H05K 7/1432; H05K 7/20; H05K 7/20254; H05K 7/2039; H05K 7/20854; H05K 7/20454; H05K 7/20463; H05K 7/20472; H05K 7/205; H05K 7/2089–209; H05K 1/0201–0212; H05K 1/0218; H05K 1/021; H05K 1/029
See application file for complete search history.

(56) References Cited

U.S. PATENT DOCUMENTS

| | | | |
|---|---|---|---|
| 2011/0195585 A1* | 8/2011 | Feldmeier | H01R 13/5213 29/883 |
| 2011/0228508 A1* | 9/2011 | Inuduka | H01G 4/228 361/811 |
| 2012/0200164 A1* | 8/2012 | Nakatsu | B60L 50/61 307/82 |
| 2013/0215573 A1* | 8/2013 | Wagner | G06Q 30/0629 361/702 |
| 2014/0126154 A1 | 5/2014 | Higuchi | |
| 2017/0047739 A1 | 2/2017 | Berger | |
| 2017/0341607 A1* | 11/2017 | Sumida | H02J 7/345 |

FOREIGN PATENT DOCUMENTS

| | | |
|---|---|---|
| KR | 20160069367 A | 6/2016 |
| KR | 20170034781 A | 3/2017 |

* cited by examiner

INVERTER

CROSS REFERENCE TO RELATED APPLICATIONS

This application is a continuation of International Patent Application number PCT/EP2018/084025, filed on Dec. 7, 2018, which claims priority to German Patent Application number 20 2017 107 643.1, filed on Dec. 15, 2017, and is hereby incorporated by reference in its entirety.

FIELD

The disclosure relates to an inverter for a photovoltaic system.

BACKGROUND

An inverter for a photovoltaic system converts a DC current of a photovoltaic generator connected on the DC side into an AC current and feeds this AC current into an AC grid connected to the AC side of the inverter. The photovoltaic generator can consist of just one photovoltaic module that is connectable to the inverter directly, wherein the inverter may be installed on the photovoltaic module directly or arranged in proximity thereto, e.g. on a house roof with a multiplicity of photovoltaic modules each having a respective designated inverter assigned. The comparatively low electric power of a single photovoltaic module (usually less than 1 kW) means that reference is regularly made to a micro-inverter in this case. A disadvantage of a photovoltaic system designed using micro-inverters in this way is the relatively complicated AC wiring by means of which the inverters need to be connected to one another and to a grid connection point of the AC grid.

The photovoltaic generator can also comprise a multiplicity of photovoltaic modules that are electrically connected to one another in a series and/or parallel connection and form a string. The ends of such string are configured to be connected to DC-side connectors of an inverter. Depending on the total number of photovoltaic modules of the photovoltaic generator and hence the electric power to be converted by the inverter, such inverter is referred to as a string inverter (for example 1 kW to approximately 100 kW) or a central inverter (exceeding approximately 100 kW). Each string inverter or central inverter can comprise multiple DC-side connectors for connecting multiple strings. A disadvantage of a photovoltaic system designed using string or central inverters in this way is that the individual strings can be controlled by the inverter only jointly, e.g. regarding the commonly set operating voltage of the photovoltaic modules in a string or the complete shutdown of the string in the event of an error or hazard. In this configuration of a photovoltaic system, it is therefore not readily possible to influence the operating voltage of individual photovoltaic modules in order to set a respectively optimum operating point, which is not adjustable via the string voltage prescribed by the inverter. Such individual control of the individual photovoltaic modules may be beneficial in the event of shadowing of parts of the string, for example.

SUMMARY

The disclosure is directed to an inverter that does not have the disadvantages of the known solutions and affords advantages for the installation and operation of a photovoltaic system.

DESCRIPTION OF THE DISCLOSURE

According to the disclosure, an inverter for a photovoltaic system comprises a substantially planar baseplate having a front and a rear, wherein the rear forms an outer rear wall of the inverter. The baseplate has at least one platform-like elevation that rises in the direction of the front of the baseplate. Furthermore, the inverter has a printed circuit board having heat-generating components, wherein the printed circuit board is installed on the baseplate. The heat-generating components are arranged on the printed circuit board in the region of the platform-like elevation and are in thermal contact with the platform-like elevation, so that the heat generated by the components is effectively routed to the outside via the baseplate. Furthermore, the inverter comprises a potting compound that fills a space on the front of the baseplate and surrounds the printed circuit board, and a cover that is arranged on or in the potting compound and is joined to the baseplate. The baseplate and the cover surrounding at least part of the potting compound or surrounded at least in part by the potting compound form a housing in conjunction with possibly uncovered or external parts of the potting compound. The inverter comprises DC connectors that are arranged in pairs on at least one of the lateral end faces of the housing and which are at least partly cast in the potting compound. The inverter further comprises an AC connector that is arranged on one of the lateral end faces of the housing, wherein electrical contacts of the AC connector are connected to the printed circuit board and protrude from the potting compound.

Such an inverter is configured to be connected to a photovoltaic generator comprising at least one photovoltaic module or a string of multiple photovoltaic modules via a respective pair of its DC connectors. In one embodiment, the inverter is designed such that precisely one photovoltaic module is to be connected to each pair of its DC connectors, wherein the inverter is designed for an electric power to be converted that corresponds substantially to the sum of the maximum powers of the photovoltaic modules to be connected. This firstly means that the inverter can be designed for a comparatively low power in the range from a few 100 watts to a few kilowatts and can therefore be of very compact design. Secondly, the very compact design of the inverter means that it can be installed in direct proximity to the photovoltaic modules to be connected, in particular directly on a photovoltaic module or on a frame on which the photovoltaic modules are installed. This allows the length of DC lines between the photovoltaic modules and the inverter to be minimized. If at least two photovoltaic modules are connected to the inverter, the result is a good compromise with minimally short DC lines and AC wiring distinctly simplified as compared to a design using known microinverters. In the case of an inverter having eight DC connectors for connecting four photovoltaic modules, the photovoltaic modules may be arranged around the inverter, so that the inverter can be installed in the region of the corner at which the four photovoltaic modules meet. This embodiment permits using short connecting lines for all four photovoltaic modules. To this end, the eight DC connectors are, for example, arranged in four pairs on the four corner regions of the inverter.

The inverter comprises a compact design and simple assembly since it requires only a small number of components. In the simplest case, a prefabricated printed circuit board can be fixed on the baseplate, the cover can be put onto the baseplate, and finally the space between the baseplate and the cover can be filled with the potting compound.

The DC and AC connectors can be electrically connected to the printed circuit board before the actual assembly.

The use of the potting compound yields a hermetically sealed interior for the electrical and electronic components of the inverter, in which the electrical and electronic components of the inverter are protected from external environmental influences, wherein the cover does not need to be connected to the baseplate. Rather, the potting compound already protects the electrical and electronic components of the inverter to an adequate extent and at the same time ensures improved heat removal from the components on the printed circuit board. The cover of the inverter can moreover be, together with the baseplate, a casting mold for the potting compound, so that the potting compound can be poured directly into the space between cover and baseplate. Alternatively, the baseplate with the printed circuit board installed thereon and with the DC and AC connectors eventually in place can be cast with the potting compound in a separate casting mold, and the cover can be installed on the potting compound subsequently. The cover may be made of an electrically conductive material or coated with such a material, such that the cover may also serves as an electromagnetic shield.

To install the inverter on a photovoltaic module or a frame of a photovoltaic generator, the inverter can have a mounting tab that is arranged on the cover or on the baseplate of the inverter such that it protrudes laterally beyond the housing of the inverter. The mounting tab can be formed by a part of the baseplate or of the cover, or it may be a separate part, and it may comprise means for accommodating mounting means, in particular drill holes or grooves for accommodating screws, for latching to corresponding latching structures, for hooking into hooks or the like. Such a mounting tab simplifies installation of the inverter by fixing the inverter during its installation by means of the mounting tab.

The AC connector of the inverter may comprise a cable gland. The cable gland allows connecting an AC cable comprising multiple conductors to the electrical contacts of the AC connector and further to the printed circuit board in a simple manner. The resulting connection is adequately sealed from the surroundings by virtue of the cable screw connection.

In one embodiment of the inverter, two respective pairs of DC connectors can be connected in series or parallel with a step-up converter arranged on the printed circuit board. This allows the inverter to set a common operating point for the photovoltaic modules connected to the DC connectors in a wide voltage range.

Furthermore, the inverter can have at least two step-up converters, the outputs of which are electrically connected together in parallel and are connected to an inverter bridge circuit arranged on the printed circuit board. As a result, the inverter is capable of controlling and if necessary isolating multiple photovoltaic modules connected to the DC connectors independently of one another.

The compact design of the inverter means that further components can be arranged in the inverter, i.e. in the housing or in the potting compound of the inverter. In particular, a grid disconnector comprising at least one relay can be arranged on the printed circuit board. Additionally, the inverter can comprise a communication unit configured for powerline communication via the DC connectors and/or the AC connector.

BRIEF DESCRIPTION OF THE DRAWINGS

The disclosure is explained and described in more detail below on the basis of example embodiments depicted in the figures.

DETAILED DESCRIPTION

Figure 1:
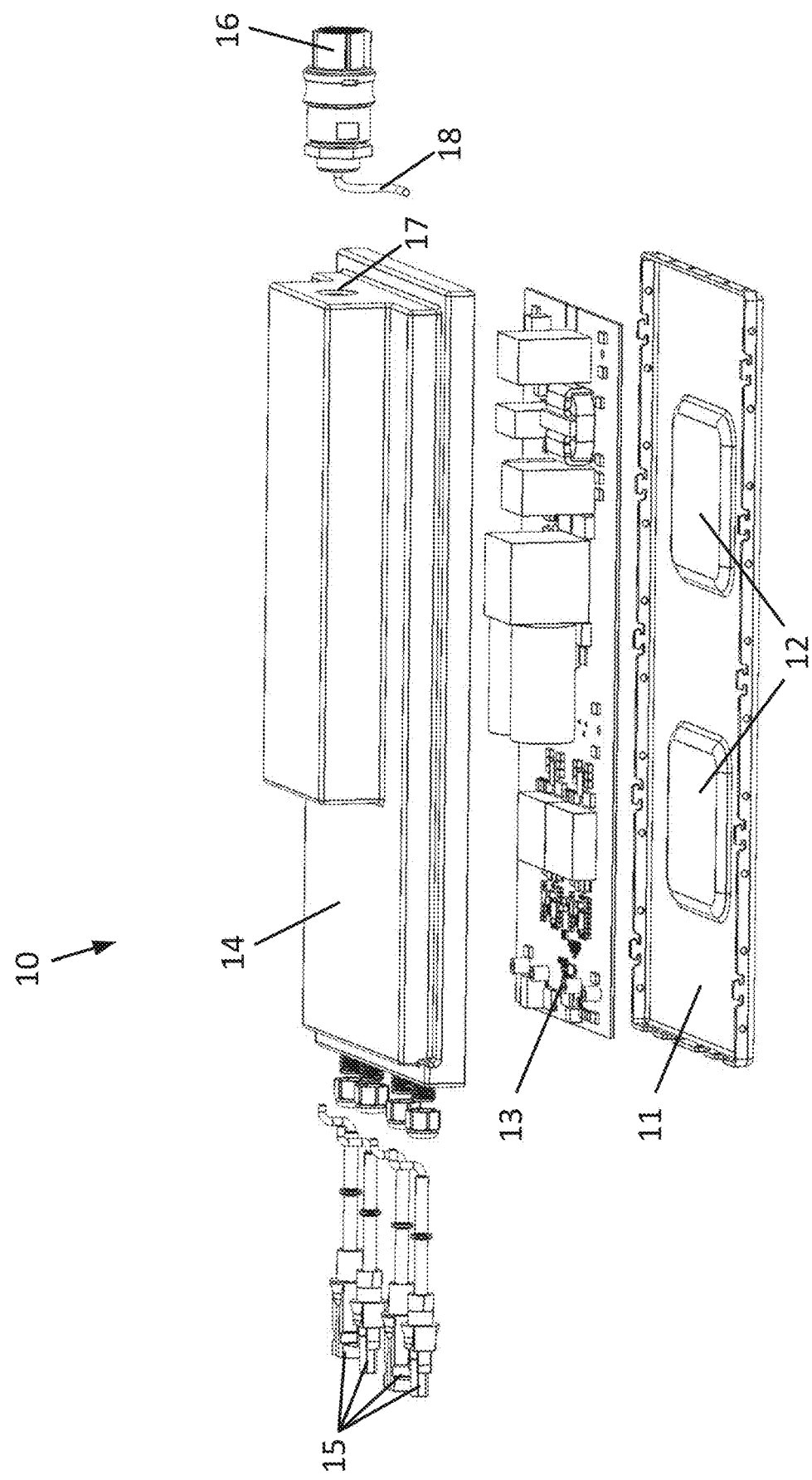
FIG. 1 shows an exploded depiction of an embodiment of the inverter according to the disclosure.

FIG. 1 shows an exploded depiction of an inverter 10 for a photovoltaic system. The inverter 10 comprises a substantially planar baseplate 11, the rear of which (not visible in FIG. 1) forms an outer rear wall of the inverter 10. The baseplate 11 has platform-like elevations 12 that rise in the direction of the front of the baseplate. Furthermore, the inverter 10 has a printed circuit board 13 that is installed on the baseplate 11 and comprises electrical and electronic components configured for generating an AC current output from a DC current source. Some of the components on the printed circuit board 13, for example, semiconductor switches of an inverter bridge circuit or coils or inductors, produce losses during operation of the inverter 10 that are converted into heat and need to be removed from the inside of the inverter 10. These heat-generating components, in particular the semiconductor switches, are installed on the printed circuit board 13 in the region of the platform-like elevations 12 such that there is thermal contact between the heat-generating components, while the rest of the printed circuit board situated outside the regions of the platform-like elevations 12 has no thermal contact with the baseplate 11.

Furthermore, the inverter 10 comprises a cover 14 that adjoins the baseplate 11 and/or rests on top of the baseplate 11. The space between the front of the baseplate 11 and the cover 14 can be completely filled with a potting compound (not depicted here), wherein the potting compound in particular surrounds the printed circuit board 13. The potting compound may largely completely cover both sides of the printed circuit board 13, if necessary with the exception of the pads between the printed circuit board 13 or the heat-generating components thereon and the platform-like elevations 12 of the baseplate 11. The baseplate 11 and the cover 14 form a housing that substantially completely surrounds at least the printed circuit board 13, wherein this housing also completely surrounding the potting compound. Alternatively or additionally, part of the housing, in particular part of the cover 14, can likewise be surrounded by the potting compound, so that the outer face of the inverter 10 is formed by the potting compound.

Furthermore, the inverter 10 comprises DC connectors 15 provided in pairs, one connector of each connector pair being configured for connection to a positive pole and the respective other connector of a connector pair being configured for connection to a negative pole of a DC source. In an assembled state of the inverter 10, the DC connectors 15 are arranged on a lateral end face of the housing in corresponding holes in the cover 14 and protrude into the housing such that at least part of them is surrounded by the potting compound situated between baseplate 11 and cover 14. In particular, part of the DC connectors 15 and possibly the whole of the electrical connection path between the DC connectors 15 and the printed circuit board 13 may be cast in the potting compound.

Furthermore, the inverter 10 comprises an AC connector 16 that is likewise arranged on a lateral end face of the housing and extends into the potting compound through a hole 17 in the cover 14, in particular by virtue of at least part of the AC connector 16 being cast in the potting compound.

The AC connector 16 is configured to connect the inverter 10 to an AC grid, i.e. the AC connector 16 comprises electrical contacts 18 that are connected to the printed circuit board 13 and are connectable to the individual conductors of the AC grid to be connected.

It goes without saying that the connectors of the inverter 10, in particular the DC connectors 15 and AC connectors 16, are not completely surrounded by the potting compound, in order to have access to the actual wires of the connectors from the outside and to be able to connect DC and AC lines thereto.

The AC connector 16 can more particularly be embodied as a cable gland, wherein a threaded portion of the cable gland protrudes from the housing through the hole 17 in the cover and a mating piece of the cable gland can be screwed onto the threaded portion from outside the housing.

The inverter 10 can be embodied such that two respective pairs of DC connectors 15 are connected in series or in parallel. These DC connectors 15 may be connected in pairs to a step-up converter arranged on the printed circuit board 13, which converter can regulate a DC voltage on the DC connectors 15.

Figure 2:
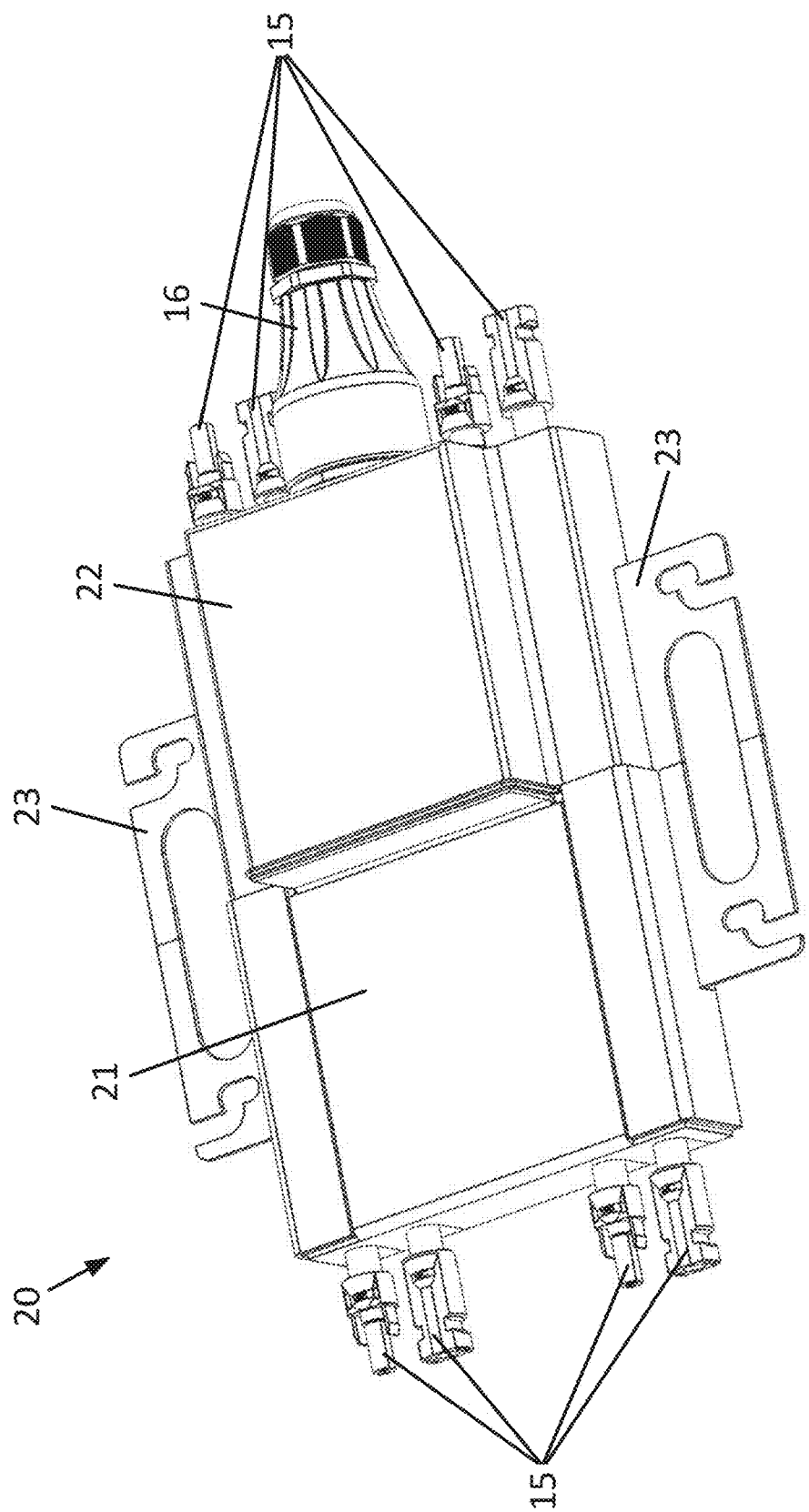
FIG. 2 shows a further embodiment of the inverter according to the disclosure in an assembled state.

FIG. 2 shows a further embodiment of an inverter 20 for a photovoltaic system in a depiction assembled ready for operation. The inverter 20 again comprises DC connectors 15, which are arranged in pairs on a lateral end face of the housing of the inverter 20, and an AC connector 16 on the same or another lateral end face of the housing of the inverter 20. The housing of the inverter 20 shown in FIG. 2 is formed by a baseplate (not visible), a cover 21 and a potting compound 22. The electrical and electronic components of the inverter 20 are arranged, analogously to those of the inverter 10 shown in FIG. 1, on a printed circuit board that is under the cover 21 and inside the potting compound 22. The potting compound 22 also extends into a region between the cover 21 and the baseplate and in particular also surrounds at least part of both the DC connectors 15 and the AC connector 16. It goes without saying that the cover 21, which, according to FIG. 2, covers only part of the potting compound 22, may also be embodied such that it covers the whole potting compound 22 and therefore forms the complete surface of the inverter 20 opposite the baseplate.

The inverter 20 furthermore has mounting tabs 23 that can be arranged on the cover 21 or on the baseplate of the inverter 20 and protrude laterally beyond the potting compound 22. The mounting tabs 23 have means for mounting the inverter 23 on a wall, a frame or else directly on a photovoltaic module, these means being in the form of grooves for accommodating screws in FIG. 2 in exemplary fashion.

In one embodiment, the inverter 20 comprises a total of four pairs of DC connectors 15, such that a total of four individual photovoltaic modules or strings of photovoltaic modules can be connected to the inverter 20. Two respective pairs of DC connectors 15 can be connected in series or parallel with a respective step-up converter arranged on the printed circuit board within the inverter 20. Furthermore, the inverter 20 may comprise two step-up converters connected in parallel with an inverter bridge circuit inside the inverter 20.

Figure 3:
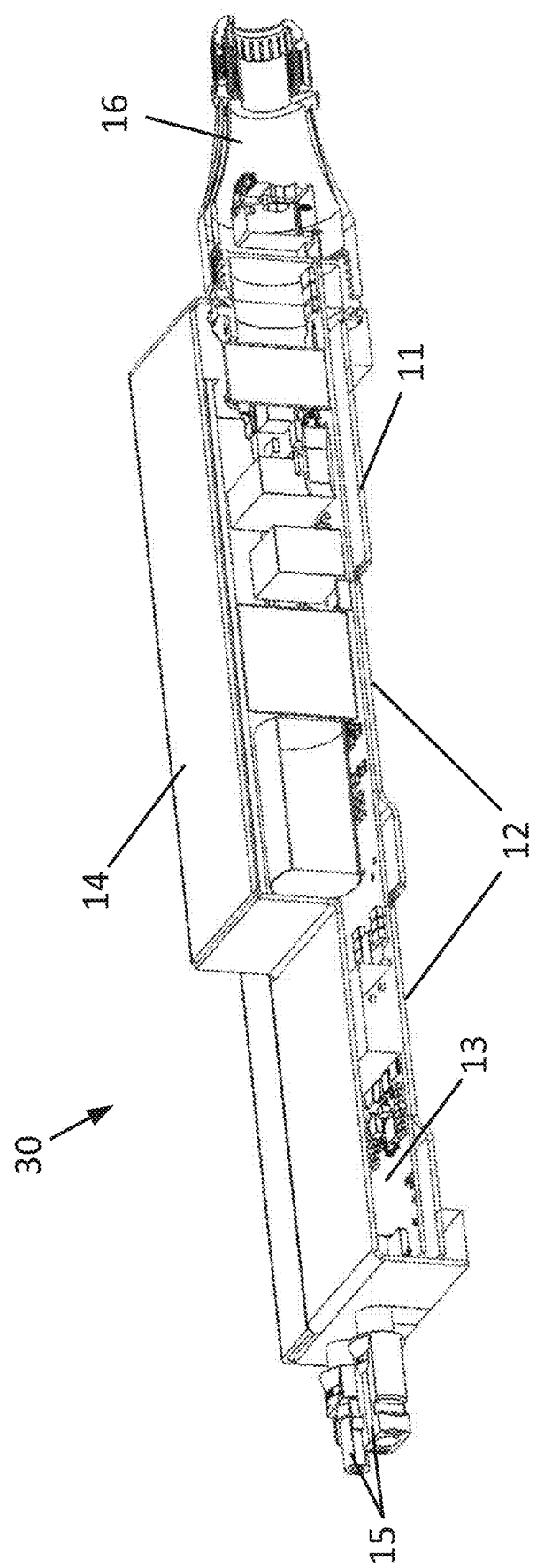
FIG. 3 shows a sectional depiction of a further embodiment of the inverter according to the disclosure.

FIG. 3 shows a sectional depiction of an embodiment of an inverter 30 for a photovoltaic system. The inverter 30 again comprises DC connectors 15, which are arranged in pairs on a lateral end face of the housing of the inverter 30, and an AC connector 16 on the same or another lateral end face of the housing of the inverter 30. The housing of the inverter 30 shown in FIG. 3 is formed by the baseplate 11 and the cover 14. The interspace between the baseplate 11 and the cover 14 can be completely filled with a potting compound (not visible in FIG. 3). The electrical and electronic components of the inverter 30 are, analogously to those of the inverters 10 and 20 shown in FIGS. 1 and 2, arranged on a printed circuit board 13 that is inside the potting compound. The printed circuit board 13 is installed on the baseplate 11, wherein heat-generating components of the inverter 30 are arranged on the printed circuit board 11 such that they are situated in the region of the platform-like elevations 12 of the baseplate 11 and are thus in thermal contact with the baseplate 11, which ensures good dissipation of the heat generated by the components to the surroundings.

Furthermore, a grid disconnector, in particular a grid isolating relay, and/or at least one communication unit, which is configured for powerline communication via the DC connectors 15 and/or the AC connector 16, can be arranged on the printed circuit board 13. This naturally applies to all depicted inverters 10, 20, 30 shown in FIGS. 1-3.

The invention claimed is:

1. An inverter for a photovoltaic system, comprising:
   a substantially planar baseplate having a front and a rear, wherein the rear forms an outer rear wall of the inverter, and having at least one platform-like elevation that rises in a direction of the front of the substantially planar baseplate,
   a printed circuit board having one or more heat-generating components, wherein the printed circuit board is installed on the baseplate such that the one or more heat-generating components are arranged on the printed circuit board in a region of the platform-like elevation and are in thermal contact with the platform-like elevation,
   a potting compound that fills a space on the front of the baseplate and surrounds portions of the printed circuit board,
   a cover that is arranged on or in the potting compound and adjoins the baseplate, so that the baseplate and the cover surrounding at least part of the potting compound form a housing,
   at least four DC connectors that are arranged in pairs on at least one of lateral end faces of the housing and at least part of which are cast in the potting compound, and
   an AC connector that is arranged on one of the lateral end faces of the housing, wherein electrical contacts of the AC connector are connected to the printed circuit board.

2. The inverter as claimed in claim 1, further comprising at least one mounting tab arranged on the cover or on the baseplate such that it protrudes laterally beyond the housing of the inverter, wherein the mounting tab has means for accommodating mounting means.

3. The inverter as claimed in claim 1, wherein the AC connector comprises a cable gland.

4. The inverter as claimed in claim 1, wherein two respective pairs of DC connectors are connected in series or parallel with a step-up converter arranged on the printed circuit board.

5. The inverter as claimed in claim 1, further comprising at least two step-up converters, wherein outputs of which are electrically connected to one another in parallel and are connected to an inverter bridge circuit arranged on the printed circuit board.

6. The inverter as claimed in claim 1, further comprising a grid disconnector arranged on the printed circuit board.

7. The inverter as claimed in claim 1, further comprising at least one communication unit configured for powerline communication via the DC connectors and/or the AC connector.

8. The inverter as claimed in claim 1, wherein the at least four DC connectors comprise eight DC connectors.

9. The inverter as claimed in claim 8, wherein the eight DC connectors comprise two pairs of DC connectors residing on one end of the lateral end face of the housing, and two pairs of DC connectors residing on another, opposite end face of the housing.

10. The inverter as claimed in claim 1, wherein the baseplate and the cover surrounding at least part of the potting compound form the housing in conjunction with uncovered parts of the potting compound.

11. The inverter as claimed in claim 1, wherein the electrical contacts of the AC connector that connect to the printed circuit board protrude from the potting compound.

12. An inverter for a photovoltaic system, comprising:
a substantially planar baseplate having a front and a rear, wherein the rear forms an outer rear wall of the inverter, and having at least one platform-like elevation that rises in the direction of the front of the baseplate,
a printed circuit board having one or more heat-generating components mounted thereon, wherein the printed circuit board is installed on the baseplate such that the one or more heat-generating components are arranged on the printed circuit board in the region of the platform-like elevation and are in direct, physical and thermal contact with the platform-like elevation via the printed circuit board, wherein other portions of the printed circuit board not associated with the platform-like elevation are spaced apart from the baseplate,
a potting compound that fills a space on the front of the baseplate and surrounds portions of the printed circuit board that are spaced apart from the baseplate,
a cover arranged on or in the potting compound and adjoining the baseplate, so that the baseplate and the cover surrounding at least part of the potting compound form a housing,
at least four DC connectors that are arranged in pairs on at least one of the lateral end faces of the housing and at least part of which are cast in the potting compound, and
an AC connector that is arranged on one of the lateral end faces of the housing, wherein electrical contacts of the AC connector are connected to the printed circuit board.

13. The inverter as claimed in claim 12, wherein the at least four DC connectors comprise eight DC connectors.

14. The inverter as claimed in claim 13, wherein the eight DC connectors comprise two pairs of DC connectors residing on one end of the lateral end face of the housing, and two pairs of DC connectors residing on another, opposite end face of the housing.

15. The inverter as claimed in claim 12, further comprising at least one mounting tab arranged on the cover or on the baseplate such that it protrudes laterally beyond the housing of the inverter, wherein the mounting tab has means for accommodating mounting means.

16. The inverter as claimed in claim 12, wherein the AC connector comprises a cable gland.

17. The inverter as claimed in claim 12, wherein at least two respective pairs of DC connectors are connected in series or parallel with a step-up converter arranged on the printed circuit board.

18. The inverter as claimed in claim 12, further comprising at least two step-up converters residing on the printed circuit board, the outputs of which are electrically connected to one another in parallel and are connected to an inverter bridge circuit arranged on the printed circuit board.

19. The inverter as claimed in claim 12, further comprising a grid disconnector arranged on the printed circuit board.

20. The inverter as claimed in claim 12, further comprising at least one communication unit residing on the printed circuit board and configured for powerline communication via the DC connectors and/or the AC connector.

* * * * *